United States Patent
Im

(10) Patent No.: US 10,903,297 B2
(45) Date of Patent: Jan. 26, 2021

(54) BIDIRECTIONAL ORGANIC LIGHT EMITTING DISPLAY DEVICE

(71) Applicant: LG Display Co., Ltd., Seoul (KR)

(72) Inventor: Hun Bae Im, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 32 days.

(21) Appl. No.: 15/818,487

(22) Filed: Nov. 20, 2017

(65) Prior Publication Data
US 2018/0190748 A1    Jul. 5, 2018

(30) Foreign Application Priority Data

Dec. 29, 2016   (KR) .......................... 10-2016-0182423

(51) Int. Cl.
*H01L 27/32* (2006.01)
*H01L 51/52* (2006.01)

(52) U.S. Cl.
CPC ........ *H01L 27/3267* (2013.01); *H01L 27/322* (2013.01); *H01L 27/326* (2013.01); *H01L 27/3248* (2013.01); *H01L 51/5271* (2013.01); *H01L 51/5284* (2013.01); *H01L 51/5218* (2013.01); *H01L 51/5234* (2013.01); *H01L 2227/323* (2013.01)

(58) Field of Classification Search
CPC .............................................. H01L 2251/5323
See application file for complete search history.

(56) References Cited

U.S. PATENT DOCUMENTS

| | | | | |
|---|---|---|---|---|
| 7,221,092 B2 * | 5/2007 | Anzai | ................... | G06F 1/3265 313/506 |
| 7,919,920 B2 * | 4/2011 | Kwak | ..................... | C03C 17/40 313/512 |
| 8,735,872 B2 * | 5/2014 | Kim | .................... | H01L 27/3267 257/40 |
| 2004/0077725 A1 * | 4/2004 | Reguri | ................. | C07C 271/34 514/563 |
| 2004/0227159 A1 * | 11/2004 | Nakashima | .......... | G09G 3/3225 257/202 |
| 2005/0269941 A1 | 12/2005 | Kim et al. | | |

(Continued)

FOREIGN PATENT DOCUMENTS

EP         1 603 161 A2   12/2005
KR   10-2007-0041270 A    4/2007

*Primary Examiner* — Nduka E Ojeh
(74) *Attorney, Agent, or Firm* — Seed IP Law Group LLP

(57) ABSTRACT

Disclosed is an organic light emitting display device. The organic light emitting display device including a plurality of pixels provided on a substrate. The plurality of pixels each include a first emissive area emitting light in a first surface direction of the substrate, a reflective area reflecting incident light in the first surface direction of the substrate, and a second emissive area overlapping the reflective area and emitting light in a second surface direction opposite to the first surface direction of the substrate. The organic light emitting display device may further include an auxiliary color filter provided in the first emissive area. In the organic light emitting display device, since a polarizer is replaced with a color filter, a light transmittance and a color reproduction rate are enhanced, and bidirectional image display is realized through the second emissive area.

21 Claims, 10 Drawing Sheets

(56) References Cited

U.S. PATENT DOCUMENTS

| | | | |
|---|---|---|---|
| 2006/0038752 A1* | 2/2006 | Winters | G09G 3/3225 |
| | | | 345/76 |
| 2006/0066229 A1* | 3/2006 | Nimura | H01L 27/3267 |
| | | | 313/506 |
| 2009/0051285 A1* | 2/2009 | Kajiyama | H01L 51/5262 |
| | | | 313/506 |
| 2011/0221789 A1* | 9/2011 | Ota | H01L 27/3267 |
| | | | 345/690 |
| 2013/0193843 A1* | 8/2013 | Yan | H05B 33/22 |
| | | | 313/504 |
| 2015/0021571 A1* | 1/2015 | Yamakita | H01L 51/5228 |
| | | | 257/40 |
| 2016/0181332 A1* | 6/2016 | Park | H01L 27/3246 |
| | | | 257/88 |
| 2016/0268362 A1* | 9/2016 | Shi | H01L 27/3267 |
| 2018/0130971 A1* | 5/2018 | Asozu | H01L 27/322 |
| 2018/0151824 A1* | 5/2018 | Park | H01L 27/322 |

* cited by examiner

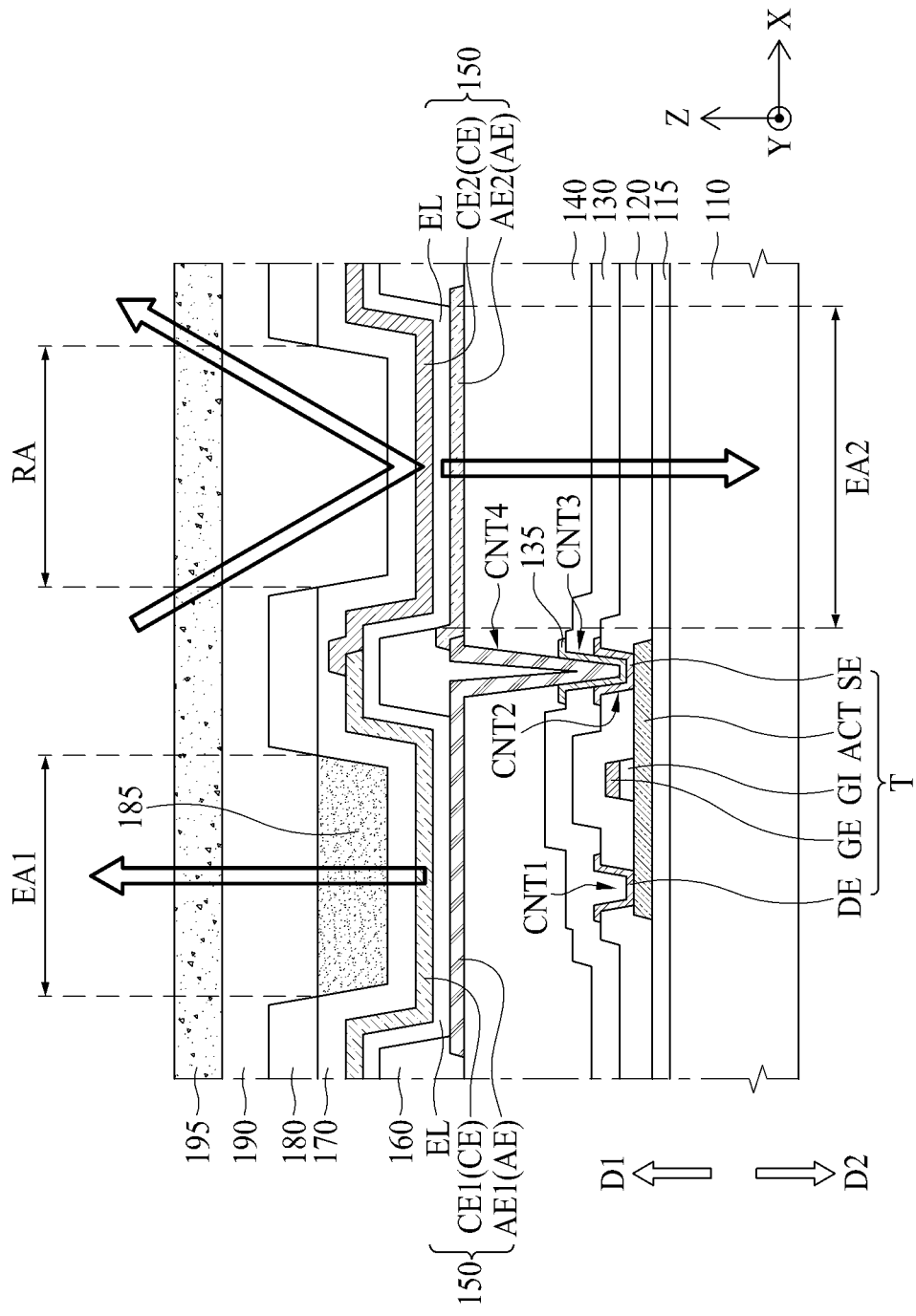

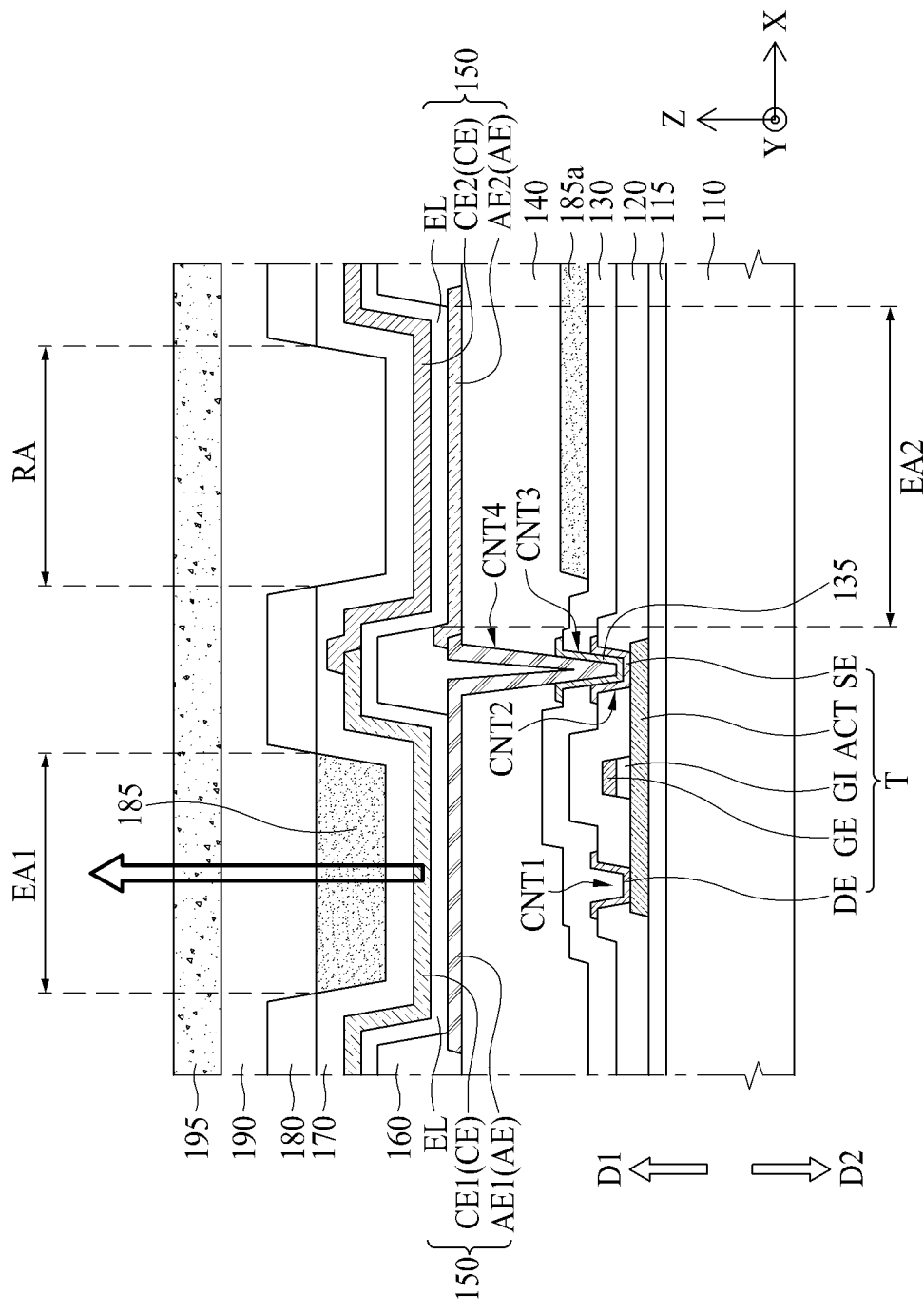

BIDIRECTIONAL ORGANIC LIGHT EMITTING DISPLAY DEVICE

CROSS-REFERENCE TO RELATED APPLICATIONS

This application claims the benefit of the Korean Patent Application No. 10-2016-0182423 filed Dec. 29, 2016, which is hereby incorporated by reference as if fully set forth herein.

BACKGROUND

Technical Field

The present disclosure relates to an organic light emitting display device.

Description of the Related Art

With the advancement of information-oriented society, various requirements for display devices for displaying an image are increasing. As a type of display device, organic light emitting display devices are self-emitting display devices and have a wide viewing angle, an excellent contrast, and a fast response time, thereby attracting much attention as next-generation display devices.

Recently, interest in a mirror function which enables a user to use an organic light emitting display device like a mirror is increasing.

In a related art organic light emitting display device having a mirror function, a reflector is provided in each of a plurality of pixels, and the mirror function is performed by reflecting external light through the reflector in a non-driving period where an image is not displayed.

Moreover, the related art organic light emitting display device having the mirror function includes a thin film transistor (TFT) substrate including the plurality of pixels which each include a first emissive area and a reflective part, an encapsulation substrate which includes a reflector overlapping the reflective part of each pixel and is bonded to the TFT substrate, and a polarizer attached on the encapsulation substrate. In the related art organic light emitting display device having the mirror function, due to the polarizer for preventing the dazzle of a screen, a light transmittance of each pixel is reduced, and a color reproduction rate is reduced.

Recently, research and development are being done on organic light emitting display devices where an image is realized through both surfaces thereof. However, in the related art organic light emitting display device having the mirror function, since a pixel circuit is not provided in the reflective part of each pixel, it is impossible to realize bidirectional image display.

SUMMARY

Accordingly, the present disclosure is directed to provide an organic light emitting display device that substantially obviates one or more problems due to limitations and disadvantages of the related art.

An aspect of the present disclosure is directed to provide an organic light emitting display device in which a light transmittance and a color reproduction rate are enhanced and bidirectional image display is realized.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device including a plurality of pixels provided on a substrate. The plurality of pixels each include a first emissive area emitting light in a first surface direction of the substrate, a reflective area reflecting incident light in the first surface direction of the substrate, and a second emissive area overlapping the reflective area and emitting light in a second surface direction opposite to the first surface direction of the substrate.

The organic light emitting display device according to an embodiment may further include an auxiliary color filter provided in the first emissive area.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 3 is a cross-sectional view of an organic light emitting display device according to an embodiment of the present disclosure;

FIG. 5 is a cross-sectional view of an organic light emitting display device according to an embodiment of the present disclosure and illustrates an example where an auxiliary color filter is added to the organic light emitting display device illustrated in FIG. 3.

DETAILED DESCRIPTION OF THE DISCLOSURE

Figure 1:
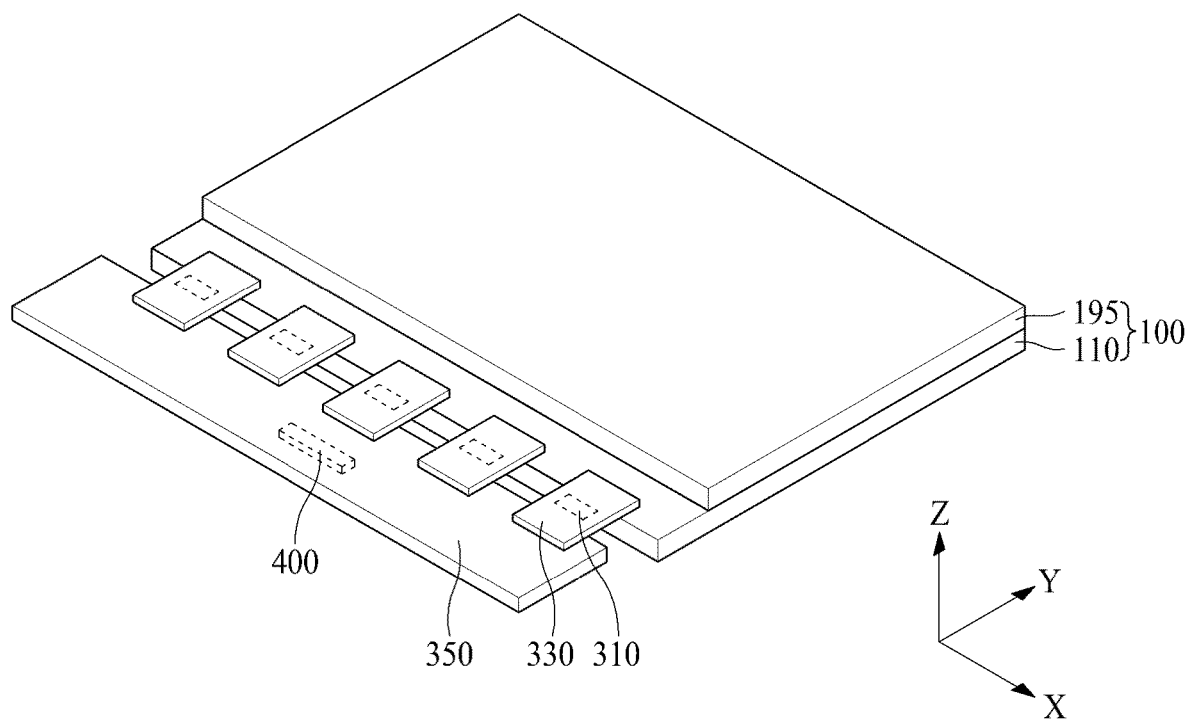
FIG. 1 is a perspective view illustrating an organic light emitting display device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein.

Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where "comprise", "have", and "include" described in the present specification are used, another part may be added unless "only~" is used. The terms of a singular form may include plural forms unless referred to the contrary.

In construing an element, the element is construed as including an error range although there is no explicit description.

In describing a position relationship, for example, when a position relation between two parts is described as "on~", "over~", "under~", and "next~", one or more other parts may be disposed between the two parts unless "just" or "direct" is used.

In describing a time relationship, for example, when the temporal order is described as "after~", "subsequent~", "next~", and "before~", the sequence which is not continuous in that order may be included unless "just" or "direct" is used in describing particular steps of the sequence.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of an organic light emitting display device according to the present disclosure will be described in detail with reference to the accompanying drawings. In the specification, in adding reference numerals for elements in each drawing, it should be noted that like reference numerals already used to denote like elements in other drawings are used for elements wherever possible.

Figure 2:
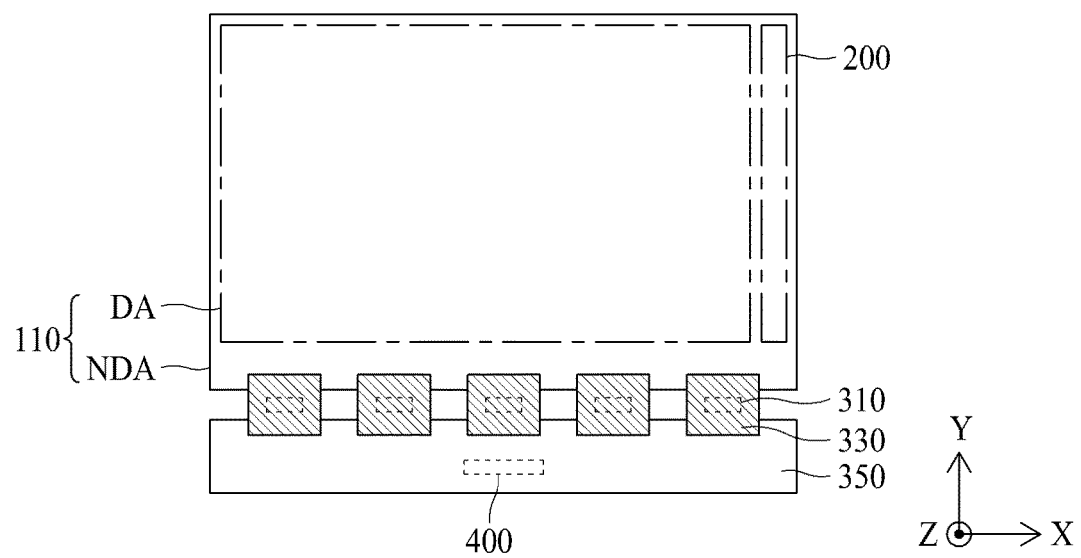
FIG. 2 is a plan view illustrating a substrate, a gate driver, a source drive integrated circuit (IC), a flexible film, a circuit board, and a timing controller of FIG. 1.

FIG. 1 is a perspective view illustrating an organic light emitting display device according to an embodiment of the present disclosure. FIG. 2 is a plan view illustrating a substrate, a gate driver, a source drive integrated circuit (IC), a flexible film, a circuit board, and a timing controller of FIG. 1. In FIGS. 1 and 2, the X axis indicates a direction parallel to a gate line, a Y axis indicates a direction parallel to a data line, and a Z axis indicates a height direction of the organic light emitting display device.

Referring to FIGS. 1 and 2, the organic light emitting display device according to an embodiment of the present disclosure may include a display panel 100, a gate driver 200, a source drive IC 310, a flexible film 330, a circuit board 350, and a timing controller 400.

The display panel 100 may include a substrate 110 and an encapsulation substrate 195.

A plurality of gate lines, a plurality of data lines, and a plurality of pixels may be provided on one surface of the substrate 110. The pixels may include a plurality of subpixels, and the plurality of subpixels may be respectively provided in a plurality of areas defined by intersections of the gate lines and the date lines.

Each of the plurality of subpixels may include at least one thin film transistor (TFT) and an organic light emitting device. When the at least one TFT is turned on by a gate signal of the gate line, each of the plurality of subpixels may be supplied with a data voltage through a data line. Each of the plurality of subpixels may control a current flowing to the organic light emitting device according to the data voltage, thereby allowing the organic light emitting device to emit light having a selected brightness.

The encapsulation substrate 195 may be disposed on face the substrate 110. The encapsulation substrate 195 may be an encapsulation substrate for preventing water from penetrating into the display panel 100. In this case, a filler or sealing layer may be provided between the substrate 110 and the encapsulation substrate 195. The encapsulation layer 195 may be bonded to the substrate 110 by the filler.

The display panel 100 according to an embodiment, as illustrated in FIG. 2, may be divided into a display area DA displaying an image and a non-display area NDA which does not display an image. The gate lines, the data lines, and the pixels may be provided in the display area DA. The gate driver 200 and a plurality of pads may be provided in the non-display area NDA.

The gate driver 200 may sequentially supply gate signals to the gate lines according to a gate control signal input from the timing controller 400. The gate driver 200 may be provided in the non-display area NDA outside one side or both sides of the display area DA of the display panel 100 in a gate driver-in panel (GIP) type. Alternatively, the gate driver 200 may be manufactured as a driving chip and may be mounted on the flexible film 330 or the circuit board 350, and moreover, may be attached on the non-display area NDA outside the one side or the both sides of the display area DA of the display panel 100 in a tape automated bonding (TAB) type.

The source drive IC 310 may receive digital video data and a source control signal from the timing controller 400. The source driver IC 310 may convert the digital video data into analog data voltages according to the source control signal and may respectively supply the analog data voltages to the data lines. If the source drive IC 310 is manufactured as a driving chip, the source drive IC 310 may be mounted on the flexible film 330 in a chip-on film (COF) type or a chip-on plastic (COP) type or as a standard package on the printed circuit board 350, near controller 400.

Lines connecting the pads to the source drive IC 310 and lines connecting the pads to lines of the circuit board 350 may be provided on the flexible film 330. The flexible film 330 may be attached on the pads by using an anisotropic conductive film, and thus, the pads may be connected to the lines of the flexible film 330. If there is more than one source drive IC 310 or other IC chips, they can be mounted on other flexible films 330 or on the PCB 400.

The circuit board 350 may be attached on the flexible film 330 which is provided in plurality. A plurality of circuits implemented as driving chips may be mounted on the circuit board 350. For example, the timing controller 400 may be mounted on the circuit board 350. The circuit board 350 may be a printed circuit board (PCB) or a flexible printed circuit board (FPCB).

The timing controller 400 may receive the digital video data and a timing signal from an external system board (not shown) through a cable of the circuit board 350. The timing controller 400 may generate a gate control signal for controlling an operation timing of the gate driver 200 and a source control signal for controlling the source drive IC 310 which is provided in plurality, based on the timing signal. The timing controller 400 may supply the gate control signal to the gate driver 200 and may supply the source control signal to the plurality of source drive ICs 310.

FIG. 3 is a cross-sectional view of an organic light emitting display device according to an embodiment of the present disclosure and schematically illustrates one cross-sectional surface of the display area DA illustrated in FIG. 2.

Referring to FIG. 3, a plurality of pixels included in the organic light emitting display device according to the present embodiment may each include a first emissive area EA1, a reflective area RA, and a second emissive area EA2.

The first emissive area EA1 may correspond to an area which emits light in a first surface direction D1 toward a first surface of a substrate, and the reflective area RA may correspond to an area which reflects light, which is incident on the substrate, in the first surface direction D1 of the substrate. The second emissive area EA2 may correspond to an area which overlaps the reflective area RA and emits light in a second surface direction D2 toward a second surface opposite to the first surface of the substrate. Also, the first surface direction D1 may correspond to a direction from a pixel electrode AE to a common electrode CE, and the second surface direction D2 may be opposite thereto. A structure of each of the areas will be described below.

The organic light emitting display device according to an embodiment may realize a double-sided device which provides light to both surfaces through the first emissive area EA1 and the second emissive area EA2. Accordingly, the double-sided device may be manufactured without damaging an organic material, and a bidirectional screen having high luminance may be implemented with low power.

The organic light emitting display device according to an embodiment of the present disclosure may include a substrate 110, a TFT T, a passivation layer 130, an intermediate metal 135, a planarization layer 140, an organic light emitting device 150, a bank 160, an encapsulation layer 170, a black matrix 180, a color filter 185, a filler 190, and an encapsulation substrate 195.

The substrate 110 may each be a glass substrate or a flexible plastic substrate. For example, the substrate 110 may be a sheet or a film which includes cellulose resin such as triacetyl cellulose (TAC), diacetyl cellulose (DAC), or the like, cyclo olefin polymer (COP) such as norbornene derivatives or the like, acryl resin such as cyclo olefin copolymer (COC), poly(methylmethacrylate) (PMMA), or the like, polyolefin such as polycarbonate (PC), polyethylene (PE), polypropylene (PP), or the like, polyester such as polyvinyl alcohol (PVA), poly ether sulfone (PES), polyetheretherketone (PEEK), polyetherimide (PEI), polyethylenenaphthalate (PEN), polyethyleneterephthalate (PET), or the like, polyimide (PI), polysulfone (PSF), fluoride resin, and/or the like, but is not limited thereto.

A buffer layer 115 may be further provided on the substrate 110. The buffer layer 115 may be provided all over an upper surface of the substrate 110. The buffer layer 115 prevents water from penetrating into the display panel 100. The buffer layer 115 may be formed of an inorganic insulating material, for example, silicon dioxide ($SiO_2$), silicon nitride (SiNx), or a multilayer thereof, but is not limited thereto.

The TFT T may be provided on the substrate 110. The TFT T may include an active layer ACT, a gate insulation layer GI, a gate electrode GE, an interlayer dielectric 120, a drain electrode DE, and a source electrode SE.

The active layer ACT may be provided on the substrate 110. The active layer ACT may be disposed to overlap the gate electrode GE. The active layer ACT may include a drain area disposed in the drain electrode DE side, a source area in the source electrode SE side, and a channel area disposed between the drain area and the source area. In this case, the channel area may include a semiconductor material on which a dopant is not doped, and the drain area and the source area may each include a semiconductor material with a dopant doped thereon.

The gate insulation layer GI may be provided on the active layer ACT. The gate insulation layer GI may insulate the active layer ACT from the gate electrode GE. The gate insulation layer GI may be provided to cover the active layer ACT. The gate insulation layer GI may be formed of an inorganic insulating material, for example, silicon dioxide ($SiO_2$), silicon nitride (SiNx), or a multilayer thereof, but is not limited thereto.

The gate electrode GE may be provided on the gate insulation layer GI. The gate electrode GE may overlap the channel area of the active layer ACT with the gate insulation layer GI therebetween. The gate electrode GE may be a single layer or a multilayer including, for example, one of molybdenum (Mo), aluminum (Al), chromium (Cr), gold (Au), titanium (Ti), nickel (Ni), neodymium (Nd), and copper (Cu) or an alloy thereof, but is not limited thereto.

The interlayer dielectric 120 may be provided on the gate electrode GE. The interlayer dielectric 120 may insulate the gate electrode GE from the drain electrode DE or the source electrode SE. The interlayer dielectric 120 may be formed of an inorganic insulating material (for example, silicon dioxide ($SiO_2$), silicon nitride (SiNx), or a multilayer thereof) which is the same as that of the gate insulation layer GI, but is not limited thereto.

The source electrode SE and the drain electrode DE may be disposed on the interlayer dielectric 120 and may be spaced apart from each other. A first contact hole CNT1, exposing a portion of the drain area of the active layer ACT, and a second contact hole CNT2 which exposes a portion of the source area of the active layer ACT may be provided in the gate insulation layer GI and the interlayer dielectric 120. The drain electrode DE may be connected to the drain area of the active layer ACT through the first contact hole CNT1, and the source electrode SE may be connected to the source area of the active layer ACT through the second contact hole CNT2.

A configuration of the TFT T is not limited to the above-described embodiment and may be variously modified into a configuration capable of being easily realized by those skilled in the art.

The passivation layer 130 may be provided on the interlayer dielectric 120. The passivation layer 130 may insulate the source electrode SE of the TFT T from the intermediate metal 135 and may protect the TFT T. The passivation layer 130 may be formed of an inorganic insulating material (for example, silicon dioxide ($SiO_2$), silicon nitride (SiNx), or a multilayer thereof) which is the same as that of the interlayer dielectric 120, but is not limited thereto.

The intermediate metal 135 may be provided on the passivation layer 130 in order for an electrical connection to be easily made between the source electrode SE of the TFT T and the pixel electrode AE of the organic light emitting device 150. The intermediate metal 135 may be connected to the source electrode SE of the TFT T through a third contact hole CNT3. If the intermediate metal 135 is provided, a contact hole is not deeply provided, and thus, a problem of an electrical disconnection is solved.

The planarization layer 140 may be provided on the substrate 110 to cover the TFT T. The planarization layer 140 may protect the TFT T and may planarize an upper surface of the substrate 110 on which the TFT T is provided. The planarization layer 140 may be formed of an organic insulating material, for example, acryl resin, epoxy resin, phenolic resin, polyamides resin, polyimides resin, and/or the like, but is not limited thereto.

An inorganic insulation layer may be additionally provided between the TFT T and the planarization layer 140 according to an embodiment. The inorganic insulation layer may protect the TFT T. In this case, the inorganic insulation layer may be formed of an inorganic insulating material (for example, silicon dioxide ($SiO_2$), silicon nitride (SiNx), or a multilayer thereof) which is the same as that of the gate insulation layer GI, but is not limited thereto.

A fourth contact hole CNT4 exposing the intermediate metal 135 may be provided in the planarization layer 140 according to an embodiment. The intermediate metal 135 may be electrically connected to the pixel electrode AE of the organic light emitting device 150 through the fourth contact hole CNT4, and the source electrode SE of the TFT T may be connected to the pixel electrode AE of the organic light emitting device 150 through the intermediate metal 135.

The organic light emitting device 150 may be provided on the planarization layer 140. The organic light emitting device 150 may include the pixel electrode AE, an organic light emitting layer EL, and the common electrode CE.

The pixel electrode AE may be provided on the planarization layer 140. The pixel electrode AE may be connected to the source electrode SE of the TFT T through the third contact hole CNT3 which is provided in the planarization layer 140. The pixel electrode AE may correspond to an anode. The pixel electrode AE may be supplied with a hole through the source electrode SE of the TFT T and may inject the hole into the organic light emitting layer EL.

The pixel electrode AE according to an embodiment may include a first pixel electrode pattern AE1 and a second pixel electrode pattern AE2.

The first pixel electrode pattern AE1 may be provided in the first emissive area EA1 and may include a reflective material for allow light emitted from the organic light emitting layer EL to travel in the first surface direction D1. The first pixel electrode pattern AE1 may have a thickness of about 51 nm to 100 nm so as to reflect all of light and may be formed of aluminum (Al), silver (Ag), and/or the like.

The second pixel electrode pattern AE2 may be provided in the second emissive area EA2 and may include a transparent material for allowing the light emitted from the organic light emitting layer EL to travel in the second surface direction D2. The second pixel electrode pattern AE2 may be formed of indium tin oxide (ITO), indium zinc oxide (IZO), and/or the like and may not reflect the light emitted from the organic light emitting layer EL but may transmit the light to allow the light to travel in the second surface direction D2.

The organic light emitting layer EL may be provided on the pixel electrode AE and the bank 160. The organic light emitting layer EL may include a hole transporting layer, a light emitting layer, and an electron transporting layer. Furthermore, the organic light emitting layer EL may further include one or more function layers for enhancing the emission efficiency and/or lifetime of the light emitting layer.

The common electrode CE may be provided on the organic light emitting layer EL. When a voltage is applied to the pixel electrode AE and the common electrode CE, a hole and an electron may respectively move to the organic light emitting layer EL through the hole transporting layer and the electron transporting layer and may be combined with each other to emit light in the organic light emitting layer EL.

The common electrode CE according to an embodiment may be divided into a first common electrode pattern CE1 and a second common electrode pattern CE2.

The first common electrode pattern CE1 may be provided in the first emissive area EA1 and may include a transparent material for allowing the light emitted from the organic light emitting layer EL to travel in the first surface direction D1. The first common electrode pattern CE1 may be formed of indium tin oxide (ITO), indium zinc oxide (IZO), and/or the like and may not reflect the light emitted from the organic light emitting layer EL but may transmit the light to transfer the light to the outside.

The second common electrode pattern CE2 may be provided in the reflective area RA and may include a reflective material for allow the light emitted from the organic light emitting layer EL to travel in the second surface direction D2. The second common electrode pattern CE2 may have a thickness of about 51 nm to 100 nm so as to reflect all of light and may be formed of aluminum (Al), silver (Ag), and/or the like.

The second common electrode pattern CE2 may reflect the light emitted from the organic light emitting layer EL to allow the light to travel in the second surface direction D2. Also, the second common electrode pattern CE2 may reflect external light to perform a mirror function.

The bank 160 may be provided between adjacent pixel electrodes AE and may define an opening area. The bank 160 according to an embodiment may include an organic material such as benzocyclobutadiene, acryl, polyimide, or the like. Additionally, the bank 160 may be formed of a photosensitive agent including a black pigment, and in this case, the bank 160 may act as a light blocking member (or a black matrix).

The encapsulation layer 170 may be provided on the organic light emitting device 150. The encapsulation layer 170 may be provided on the common electrode CE. The encapsulation layer 170 may be provided to contact the filler 190. The encapsulation layer 170 may be formed for preventing water from penetrating into each pixel and for protecting the organic light emitting device 150 vulnerable to external water or oxygen. The encapsulation layer 170 according to an embodiment may be formed of an inorganic layer or an organic layer, or may be formed in a multi-layer structure where an inorganic layer and an organic layer are alternately stacked.

The encapsulation layer 170 according to an embodiment may include a first inorganic layer, an organic layer covering the first inorganic layer, and a second inorganic layer covering the organic layer, which are provided on the substrate 110.

The first inorganic layer may be disposed closest to the organic light emitting device 150 and may be formed of an inorganic insulating material, which enables low temperature deposition to be performed, such as nitride silicon (SiNx), oxide silicon (SiOx), oxynitride silicon (SiON), oxide aluminum (AlxOy), or the like.

The organic layer may be provided on the substrate 110 to cover a whole portion of the first inorganic layer. The organic layer decreases a stress between layers caused by the bending of the display device and reinforces planarization performance. The organic layer according to an embodiment may include an organic insulating material such as benzocyclobutadiene, acryl, polyimide, or the like.

The second inorganic layer may be provided on the substrate 110 to cover a whole portion of the organic layer and each of side surfaces of the first inorganic layer. The second inorganic layer primarily prevents external water or oxygen from penetrating into the organic layer and the first inorganic layer. The second inorganic layer according to an embodiment may be formed of an inorganic insulating material, which enables low temperature deposition to be performed, such as nitride silicon (SiNx), oxide silicon (SiOx), oxynitride silicon (SiON), oxide aluminum (AlxOy), or the like, or may be formed of a material which is the same as that of the first inorganic layer.

The black matrix 180 may define an opening area of each pixel provided on the substrate 110. That is, the black matrix 180 may be provided on the encapsulation substrate 195 overlapping a light blocking area other than an opening area overlapping the organic light emitting device 150 of each pixel, thereby preventing color mixture between adjacent opening areas. The black matrix 180 according to an embodiment may include a plurality of first light blocking patterns which cover the plurality of gate lines and the pixel circuits of the pixels, a plurality of second light blocking patterns which cover the plurality of data lines and a plurality of pixel driving power lines, and a third light blocking pattern which covers an edge of the encapsulation layer 170.

The color filter 185 may be directly formed on a top of the encapsulation layer 170 overlapping the opening area defined by the black matrix 180 and may be provided on the encapsulation layer 170 in the first emissive area EA1. The organic light emitting device 150 according to an embodiment may correspond to a white organic light emitting device, and thus, the color filter 185 may transmit only light, having a wavelength of a color corresponding to a corresponding pixel, of white light. The color filter 185 may include a red color filter, a green color filter, and a blue color filter respectively corresponding to colors defined in a plurality of pixels.

Since the organic light emitting display device according to the present embodiment includes the color filter 185, a related art polarizer (for example, a circular polarizer) for preventing dazzle may be removed, and thus, a light transmittance and a color reproduction rate of each pixel are enhanced.

The filler 190 may be provided on the encapsulation layer 170. The filler 190 may contact the encapsulation layer 170. The filler 190 protects the TFT T, the organic light emitting device 150, etc., from an external impact. Also, the filler 190 may perform a function of bonding the substrate 110 to the encapsulation substrate 195. The filler 190 may be formed of acrylic or epoxy-based resin having a good visible light transmittance, for example, a visible light transmittance of 90% or more.

The encapsulation substrate 195 may be provided on the organic light emitting device 150 and the encapsulation layer 170. The encapsulation substrate 195 may be provided on a whole surface. The encapsulation substrate 195 may be an encapsulation substrate. The encapsulation substrate 195 prevents water from penetrating into the display panel 100. Also, the encapsulation substrate 195 protects the organic light emitting device 150 and the TFT T, which are included in the display panel 100, from an external impact.

FIGS. 4A to 4G are cross-sectional views for describing a method of manufacturing an organic light emitting display device according to an embodiment of the present disclosure. Therefore, like reference numerals refer to like elements, and repetitive descriptions of a material and a structure of each element are omitted.

Figure 4A:
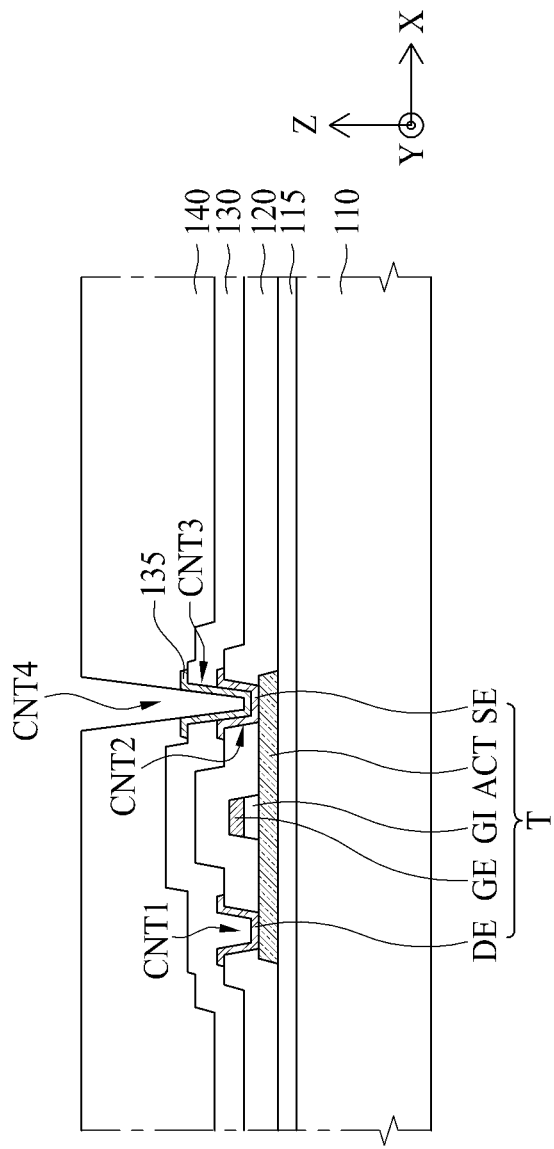
FIGS. 4A to 4G are cross-sectional views for describing a method of manufacturing an organic light emitting display device according to an embodiment of the present disclosure.

First, as illustrated in FIG. 4A, a buffer layer 115, a TFT T, a passivation layer 130, an intermediate metal 135, a planarization layer 140, and a fourth contact hole CNT4 may be sequentially formed on a substrate 110. These are made by any deposition, mask and etch process of those known in the art and, thus, each step is not described in detail.

Figure 4B:
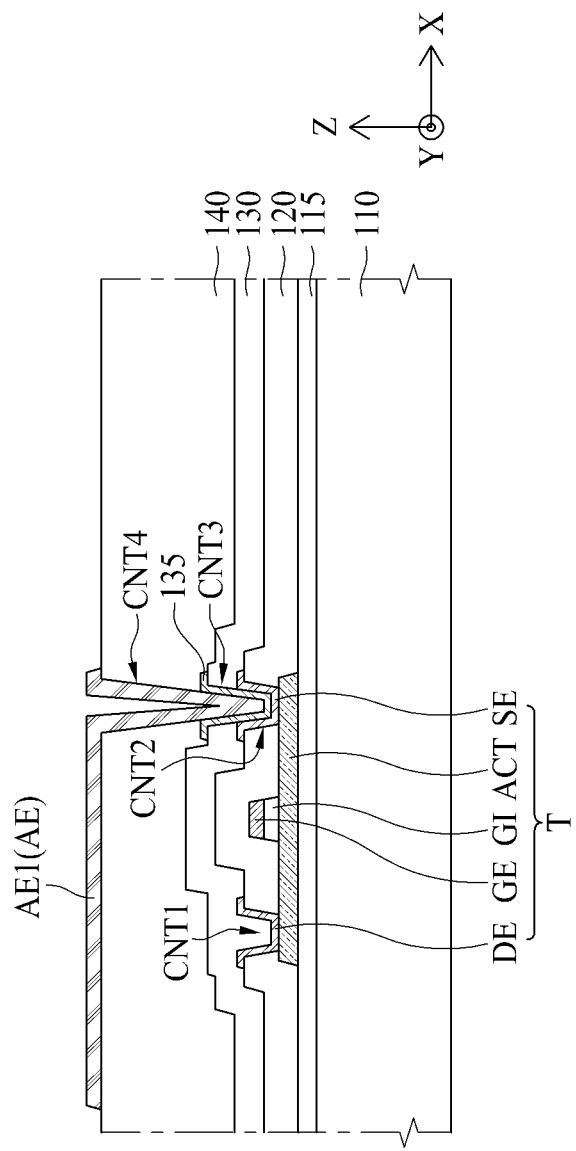

Second, as illustrated in FIG. 4B, a first pixel electrode pattern AE1 connected to the intermediate metal 135 through the fourth contact hole CNT4 may be formed in a first emissive area EA1. The first pixel electrode pattern AE1 may have a thickness of about 51 nm to 100 nm so as to reflect all of light and may be formed of a reflective material. The reflective material may be aluminum (Al) or silver (Ag), but is not limited thereto. Layer AE1 is formed by any acceptable known deposition and etch process.

Figure 4C:
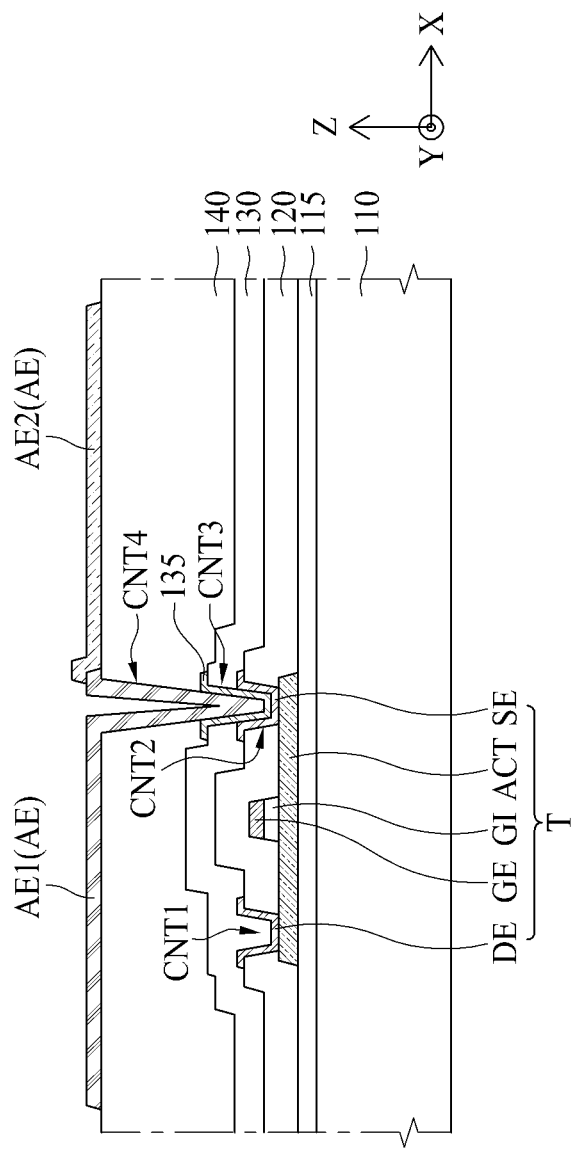

Third, as illustrated in FIG. 4C, a second pixel electrode pattern AE2 contacting the first pixel electrode pattern AE1 may be formed on the same layer as the first pixel electrode pattern AE1 in a second emissive area EA2. The second pixel electrode pattern AE2 may be formed of a transparent material so as to transmit light. The transparent material may be ITO or IZO, but is not limited thereto. Layer AE2 is formed by any acceptable known deposition and etch process.

Figure 4D:
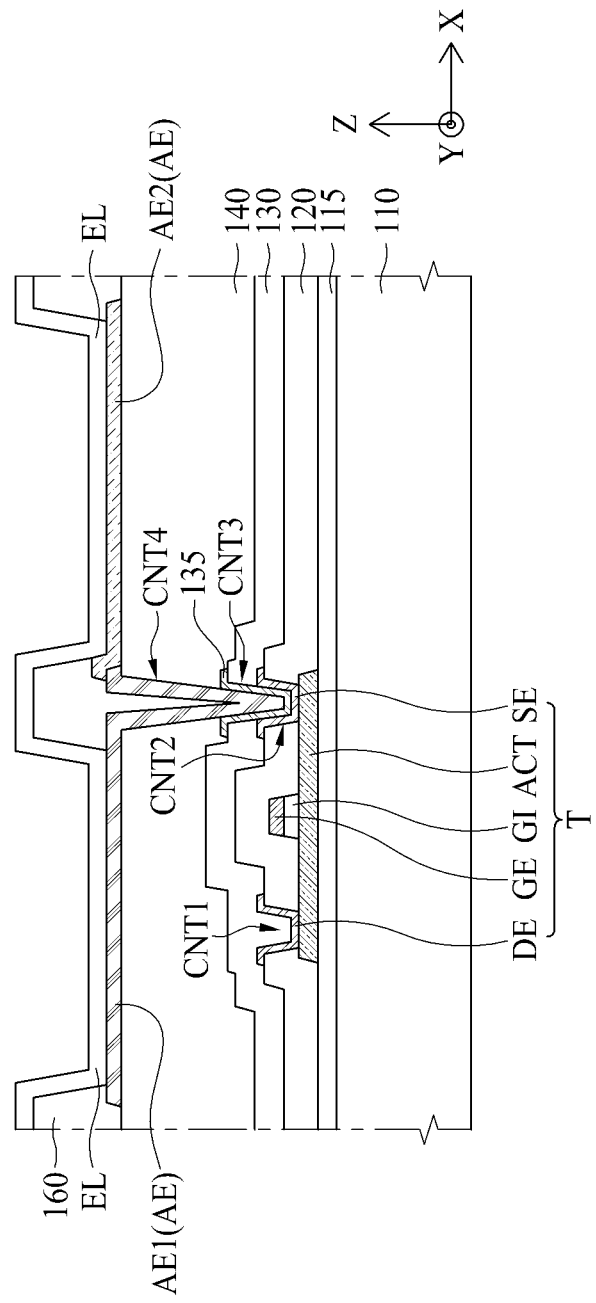

Fourth, as illustrated in FIG. 4D, a bank B and an organic light emitting layer EL may be formed on the first and second pixel electrode patterns AE1 and AE2. The bank B may be formed between the first and second pixel electrode patterns AE1 and AE2 or between adjacent pixel electrodes AE to define an opening area.

Figure 4E:
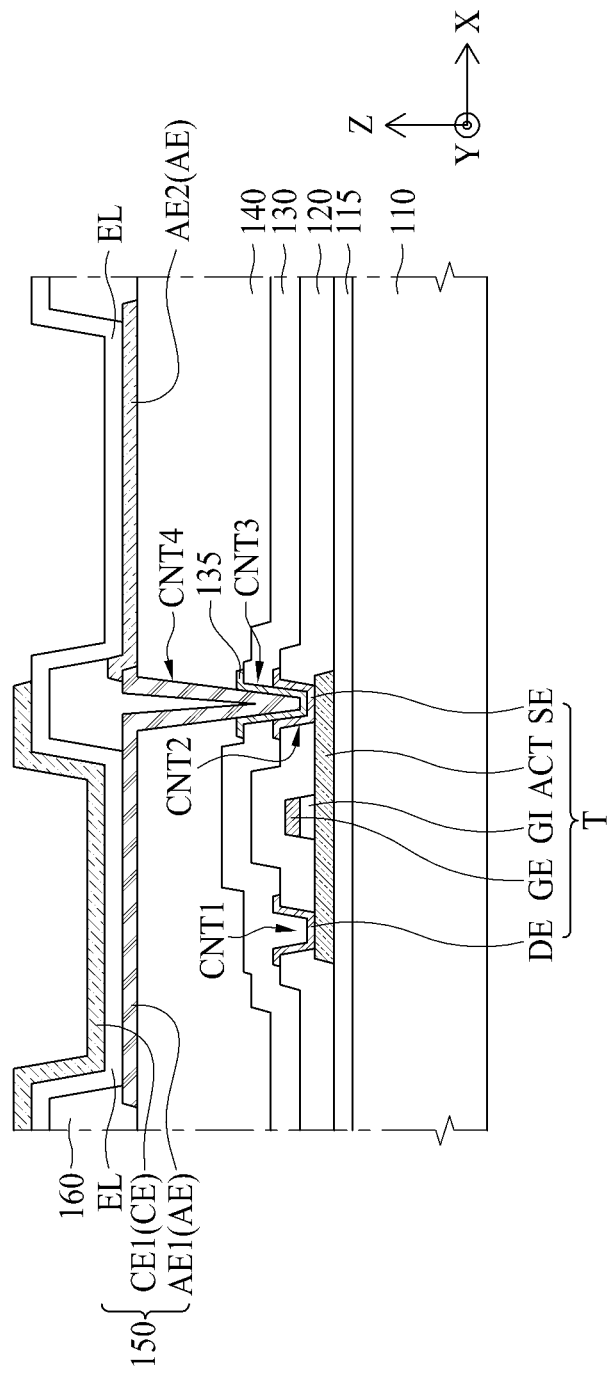

Fifth, as illustrated in FIG. 4E, a first common electrode pattern CE1 may be formed in the first emissive area EA1. The first common electrode pattern CE1 may be formed of a transparent material so as to transmit light. The transparent material may be ITO or IZO, but is not limited thereto.

Figure 4F:
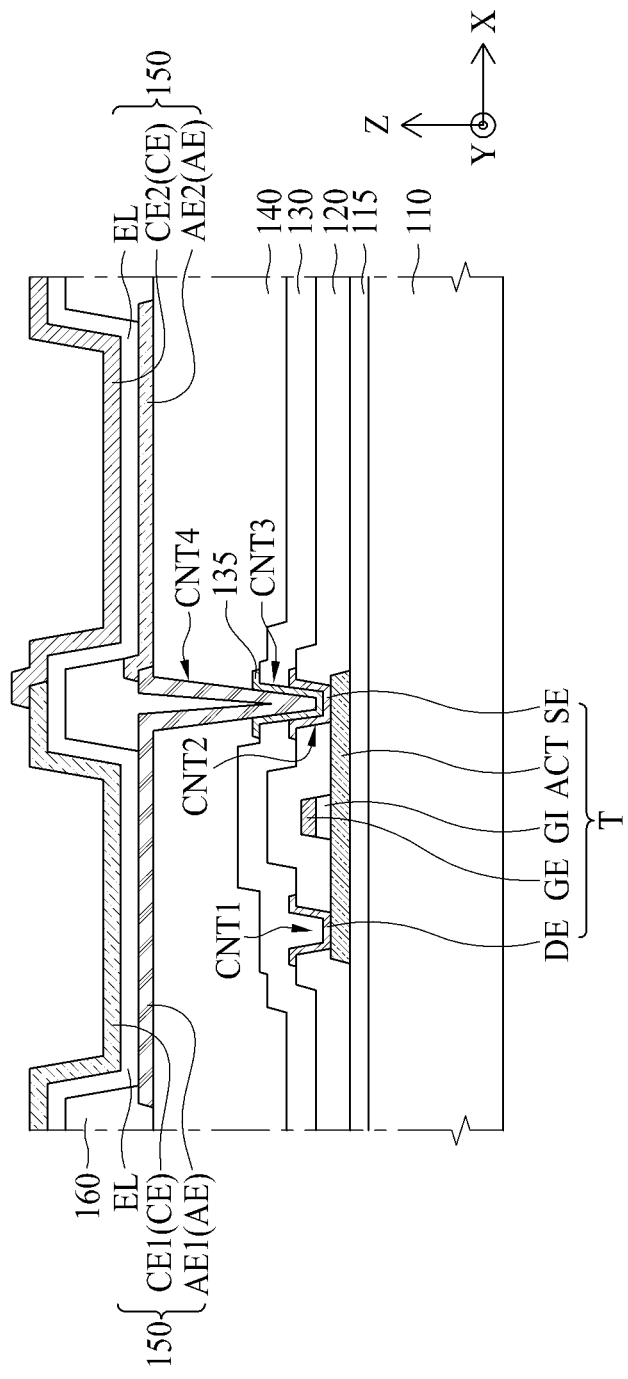

Sixth, as illustrated in FIG. 4F, a second common electrode pattern CE2 contacting the first common electrode pattern CE1 may be formed on the same layer as the first common electrode pattern CE1 in a reflective area RA. The second common electrode pattern CE2 may have a thickness of about 51 nm to 100 nm so as to reflect all of light and may be formed of a reflective material. The reflective material may be aluminum (Al) or silver (Ag), but is not limited thereto.

Figure 4G:
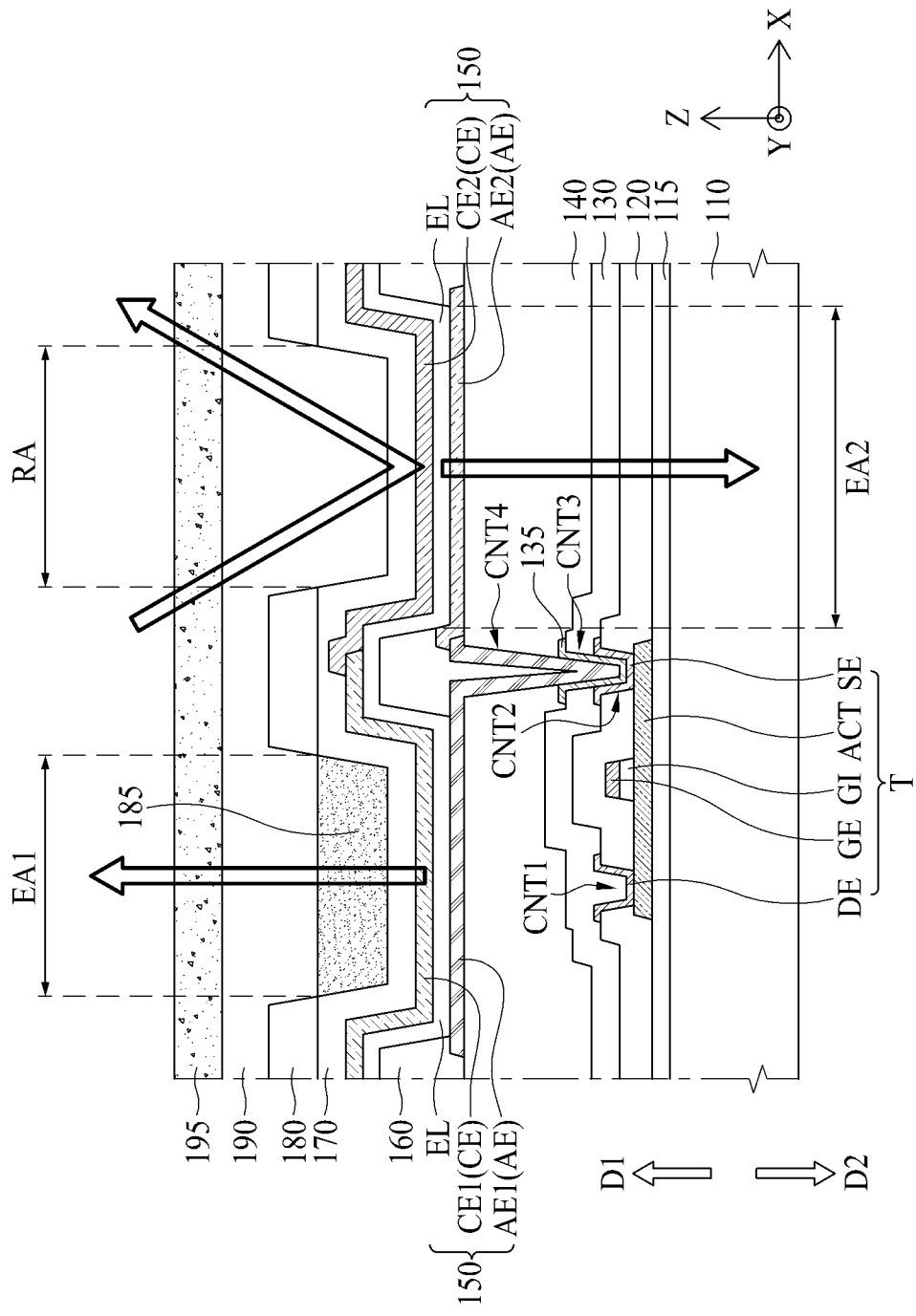

Seventh, as illustrated in FIG. 4G, an encapsulation layer 170, a black matrix 180, a color filter 185, a filler 190, and an encapsulation substrate 195 may be sequentially formed on the first and second common electrode patterns CE1 and CE2. In such a process, the first and second pixel electrode patterns AE1 and AE2 may configure a pixel electrode AE, and the first and second common electrode patterns CE1 and CE2 may configure a common electrode CE.

Since the first pixel electrode pattern AE1 is provided in the first emissive area EA1 and is formed of the reflective material, light emitted from an organic light emitting layer EL may travel in a first surface direction D1, and since the second pixel electrode pattern AE2 is provided in the second emissive area EA2 and is formed of the transparent material, the light emitted from the organic light emitting layer EL may travel in a second surface direction D2.

Since the first common electrode pattern CE1 is provided in the first emissive area EA1 and is formed of the transparent material, the light emitted from the organic light emitting layer EL may travel in the first surface direction D1, and since the second common electrode pattern CE2 is provided in the second emissive area EA2 and is formed of the reflective material, the light emitted from the organic light emitting layer EL may travel in the second surface direction D2.

The first pixel electrode pattern AE1, the second pixel electrode pattern AE2, the first common electrode pattern CE1, and the second common electrode pattern CE2 may each be formed of different materials through incremental processes at different times, and thus, may be provided in different areas to perform different functions. A common light emitting layer EL and a common drive transistor T can therefore provide light that is emitted from both the first surface D1 and the second D2. Since the very same transistor T and the same light emitting layer EL are used for both light emissions, it can be assured that the light emitted will be at the same time and have approximately the same amplitude from both surfaces. In most embodiments, the light emitted from both surfaces will pass through the color filters of the same type and thus be of the same color as well, but this is not required.

Since the same transistor, T and same layer EL are used for each pixel displayed in the direction D1 and D2, the display on both sides can be made nearly identical. By making material and thickness of AE2 the same as that for CE1 both light sources will pass through the same material and thickness of their respective transparent electrodes. By making the substrate 110 and various layers 115, 120 and 130 on side D2 to have approximately the same optical properties as layers 170, 190 and 195, on the side D1, the intensity, color and other properties of the light emitted at from that particular pixel at that location on each side can be made approximately the same. Accordingly, the organic light emitting display device according to the present embodiment may realize bidirectional image display. However, in the organic light emitting display device according to an embodiment, an order in which the pixel electrode AE and the common electrode CE are formed may switch therebetween.

FIG. 5 is a cross-sectional view of an organic light emitting display device according to an embodiment of the present disclosure and illustrates an example where an auxiliary color filter is added to the organic light emitting display device illustrated in FIG. 3. Hereinafter, therefore, only the auxiliary color filter and elements relevant thereto will be described.

Referring to FIG. 5, the organic light emitting display device according to the present embodiment may further include an auxiliary color filter 185a.

The auxiliary color filter 185a may be provided in a second emissive area EA2. That is, the auxiliary color filter 185a according to an embodiment may be provided on an interlayer dielectric 120 provided in the second emissive area EA2. The auxiliary color filter 185a according to an embodiment may be inserted into a planarization layer 140 provided in the second emissive area EA2, and in this case, the planarization layer 140 may have a two-layered structure where two layers are stacked with the auxiliary color filter 185a therebetween. For example, the planarization layer 140 may include a first planarization layer covering a TFT T and a second planarization layer covering the auxiliary color filter 185a provided on the first planarization layer.

The auxiliary color filter 185a may transmit light of any color. It can have a wavelength of a color corresponding to a corresponding particular pixel or subpixel color, whether red, blue or green. It can also provide white light. The light is emitted in a second surface direction D2 from an organic light emitting layer EL provided in the second emissive area EA2, thereby allowing a color image to be displayed in the second surface direction D2 of the substrate 110. The auxiliary color filter 185a may be formed of a material which is the same as that of the color filter 185 provided in a first emissive area EA1 if it is desired to provide exactly the same color in both directions.

Since the organic light emitting display device according to the present embodiment includes the auxiliary color filter 185a, a color image that is output from surface D2 is approximately the exact same in both timing, color, amplitude, brightness and other factors as that out of surface D1 may be displayed in the second surface direction D2 of the substrate 110.

The light emitting device can have a large display area DA that includes many thousands of pixels and subpixels identical to that shown in FIG. 3.

As described above, in the organic light emitting display device according to the embodiments of the present disclosure, since the polarizer is replaced with the color filter, a light transmittance and a color reproduction rate are enhanced, and bidirectional image display is realized through the second emissive area.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display device comprising:
 a substrate having a first surface and a second surface opposite of the first surface;
 a plurality of pixels on the substrate, the plurality of pixels each including:
  a first emissive area emitting light in a first surface direction of the substrate;
  a reflective area reflecting incident light in the first surface direction of the substrate;
  a first bank between the first emissive area and the reflective area;
  a second bank adjacent to the first emissive area;
  a third bank adjacent to the reflective area, wherein the first, second, and third banks are different from each other;
  a second emissive area overlapping the reflective area and emitting light in a second surface direction opposite to the first surface direction of the substrate, the second emissive area between the first bank and the third bank;
  an organic light emitting layer being at least one layer extending continuously over an entire top surface of the first bank, the second bank, and the third bank;
  a pixel circuit including a thin film transistor provided in the first emissive area;
  a first electrode including:
   a first electrode material connected to the thin film transistor and provided in the first emissive area, the first electrode material having a reflective material; and
   a second electrode material electrically connected to the first electrode material and provided in the second emissive area, the second electrode material having a transparent material,
  wherein the organic light emitting layer is provided on the first electrode;
  a passivation layer disposed on the thin film transistor, and disposed between the thin film transistor and the first electrode;
  a planarization layer disposed on the passivation layer, and disposed between the passivation layer and the first electrode; and
  an intermediate metal disposed between the planarization layer and the passivation layer and connecting between the thin film transistor and the first electrode, wherein the intermediate metal overlaps with the first bank.

2. The organic light emitting display device of claim 1, wherein the plurality of pixels each further comprises:
 a second electrode provided on the organic light emitting layer.

3. The organic light emitting display device of claim 2, further comprising:
 an encapsulation layer covering the second electrode of each of the plurality of pixels;
 a color filter in the first emissive area;
 a filler covering the color filter and the reflective area; and
 an encapsulation substrate attached on the filler,
 wherein the organic light emitting layer of each of the plurality of pixels emits white light.

4. The organic light emitting display device of claim 3, further comprising: an auxiliary color filter in the second emissive area.

5. The organic light emitting display device of claim claim 1, wherein the bank covers a connection part between the first electrode material in the first emissive area and the second electrode material in the reflective area.

6. The organic light emitting display device of claim claim 1, wherein the second electrode comprises:
 a first electrode material provided in the first emissive area, the first electrode material including a transparent material; and
 a second electrode material electrically connected to the first electrode material and provided in the reflective area, the second electrode material including a reflective material.

7. The organic light emitting display device of claim 1, further comprising: a color filter in the first emissive area,
 wherein the organic light emitting layer of each of the plurality of pixels emits white light.

8. The organic light emitting display device of claim 1, further comprising:
 a color filter in the first emissive area; and
 an auxiliary color filter in the second emissive area,
 wherein the organic light emitting layer of each of the plurality of pixels emits white light.

9. The organic light emitting display device of claim 1, further comprising:
 a black matrix disposed between the first emissive area and the reflective area.

10. An organic light emitting display device comprising:
 a substrate having a first surface and a second surface opposite of the first surface;
 a transistor positioned on the substrate;
 a passivation layer disposed on the transistor;
 a planarization layer disposed on the passivation layer;
 a first light reflecting layer disposed on the passivation layer and positioned overlying the transistor;
 a first emissive area emitting light in a first surface direction from the first surface of the substrate, the first emissive area being located overlying the transistor and the first light reflecting layer;
 a second reflective layer reflecting incident light in the first surface direction of the substrate, the second reflective layer being adjacent to the first emissive area;
 a second emissive area underlying the second reflective layer and emitting light in a second surface direction from the second surface of the substrate;
 a first light transparent layer positioned overlying the first emissive area;
 a second light transparent layer positioned underlying the second emissive area;
 a first bank between the first emissive area and the second emissive area;
 a second bank adjacent to the first emissive area;
 a third bank adjacent to the second emissive area, wherein the first, second, and third banks are different from each other;
 a black matrix disposed over the bank between the first emissive area and the second emissive area;
 a light emitting layer being at least one layer extending continuously over an entire top surface of the first bank, the second bank, and the third bank;
 a common electrode disposed over the light emitting layer, the common electrode including the first light transparent layer and the second reflective layer electrically connected to the first light transparent layer;

a driving electrode including the first light reflecting layer and the second light transparent layer electrically connected to the first light reflecting layer;

an electrical connection line that extends from the transistor to the driving electrode for both the first emissive area and the second emissive area; and an intermediate metal layer disposed between the planarization layer and the passivation layer and connecting between the electrical connection line and the transistor, wherein the intermediate metal layer overlaps with the first bank.

11. The organic light emitting display device of claim 10 further comprising:
an encapsulation layer overlying the first and second emissive areas.

12. The organic light emitting display device of claim 10 further comprising:
a filler layer overlying the first and second emissive areas.

13. The organic light emitting display device of claim 12 wherein an encapsulation layer overlies the filler layer.

14. The organic light emitting display device of claim 12 wherein an encapsulation layer underlies the filler layer.

15. The organic light emitting display device of claim 10 wherein the substrate is transparent.

16. The organic light emitting display device of claim 10 further comprising:
the black matrix disposed between the first emissive area and a reflective area.

17. A method of forming a light emitting display device comprising:
forming a drive transistor on a substrate;
forming a passivation layer on the drive transistor;
forming an intermediate metal layer connecting a source electrode of the drive transistor on the passivation layer;
forming a planarization layer on the intermediate metal layer and the passivation layer, wherein the intermediate metal layer is disposed between the planarization layer and the passivation layer;

forming a first light reflecting electrode overlying the drive transistor on the planarization layer and connecting to the intermediate metal layer;

forming a first light transparent electrode adjacent to the first light reflecting electrode and in approximately the same plane as the first light reflecting electrode;

forming a first bank between the first light reflecting electrode and the first light transparent electrode, a second bank adjacent to the first bank and a third bank opposite of the second bank with respect to the first bank, wherein the intermediate metal layer overlaps with the first bank;

forming a first electrical connection from the drive transistor to the first light reflecting electrode;

forming a second electrical connection from the first light reflecting electrode to the first light transparent electrode;

forming a single and continuous light emissive layer that overlies both the first light reflecting electrode and the first light transparent electrode and completely overlies top surface of the first bank, the second bank, and the third bank;

forming a second light reflecting electrode overlying the first light transparent electrode; and forming a second light transparent electrode overlying the first light reflecting electrode.

18. The method of claim 17 further including:
forming a first light color filter overlying the second light transparent electrode.

19. The method of claim 18 further including:
forming a second light color filter underlying the first light transparent electrode.

20. The method of claim 17 further including:
emitting light away from a first surface of the substrate and away from a second, opposite surface of the substrate from the first surface of the substrate at the same time from the same light emissive layer.

21. The method of claim 17 further including:
forming a black matrix between the second light reflecting electrode and the second light transparent electrode.

* * * * *

UNITED STATES PATENT AND TRADEMARK OFFICE
CERTIFICATE OF CORRECTION

PATENT NO. : 10,903,297 B2  
APPLICATION NO. : 15/818487  
DATED : January 26, 2021  
INVENTOR(S) : Hun Bae Im Page 1 of 1

It is certified that error appears in the above-identified patent and that said Letters Patent is hereby corrected as shown below:

In the Claims

Column 14, Claim 5, Lines 4-5:
"display device of claim claim 1," should read: --display device of claim 1,--.

Column 14, Claim 6, Lines 8-9:
"display device of claim claim 1," should read: --display device of claim 1,--.

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*